(12) United States Patent
Chen et al.

(10) Patent No.: US 10,033,095 B2
(45) Date of Patent: Jul. 24, 2018

(54) DECOUPLING DEVICE, RADIO FREQUENCY COIL AND MAGNETIC RESONANCE IMAGING APPARATUS

(71) Applicants: Yan Hong Chen, Shenzhen (CN); Tong Tong, Shenzhen (CN)

(72) Inventors: Yan Hong Chen, Shenzhen (CN); Tong Tong, Shenzhen (CN)

(73) Assignee: Siemens Aktiengesellschaft, München (DE)

( * ) Notice: Subject to any disclaimer, the term of this patent is extended or adjusted under 35 U.S.C. 154(b) by 663 days.

(21) Appl. No.: 14/607,898

(22) Filed: Jan. 28, 2015

(65) Prior Publication Data
US 2015/0212170 A1    Jul. 30, 2015

(30) Foreign Application Priority Data
Jan. 29, 2014  (CN) .................. 2014 2 0056732 U

(51) Int. Cl.
| | | |
|---|---|---|
| *G01V 3/00* | (2006.01) | |
| *H01Q 1/52* | (2006.01) | |
| *G01R 33/36* | (2006.01) | |
| *G01R 33/34* | (2006.01) | |

(52) U.S. Cl.
CPC .......... *H01Q 1/523* (2013.01); *G01R 33/365* (2013.01); *G01R 33/34007* (2013.01)

(58) Field of Classification Search
CPC .. A61B 5/055; G01R 33/4828; G01R 33/543; G01R 33/50; G01R 33/5608
USPC ........................................... 324/318
See application file for complete search history.

(56) References Cited

U.S. PATENT DOCUMENTS

| | | | | |
|---|---|---|---|---|
| 8,581,588 | B2 * | 11/2013 | Driesel .............. | G01R 33/3415 324/307 |
| 2004/0124840 | A1 * | 7/2004 | Reykowski ........ | G01R 33/3415 324/318 |
| 2006/0109177 | A1 * | 5/2006 | Prieto-Burgos .......... | H01Q 1/38 343/700 MS |
| 2006/0163744 | A1 * | 7/2006 | Vanheusden ........... | B82Y 30/00 257/773 |
| 2009/0230965 | A1 * | 9/2009 | DeVries ............. | G01R 33/3403 324/322 |
| 2013/0203271 | A1 * | 8/2013 | Mueller ................ | H01R 9/096 439/65 |
| 2013/0240702 | A1 * | 9/2013 | Wheeler .............. | F16M 13/022 248/297.31 |

* cited by examiner

*Primary Examiner* — Walter L Lindsay, Jr.
*Assistant Examiner* — Frederick Wenderoth
(74) *Attorney, Agent, or Firm* — Lempia Summerfield Katz LLC

(57) ABSTRACT

A decoupling device includes a first substrate, a first inductive coil printed on the first substrate, a second substrate, a second inductive coil printed on the second substrate, and a joining component. The joining component is for joining the first substrate to the second substrate. The first inductive coil and the second inductive coil have an area of overlap.

17 Claims, 2 Drawing Sheets

DECOUPLING DEVICE, RADIO FREQUENCY COIL AND MAGNETIC RESONANCE IMAGING APPARATUS

This application claims the benefit of CN 201420056732.8, filed on Jan. 29, 2014, which is hereby incorporated by reference in its entirety.

TECHNICAL FIELD

The present embodiments relate to the technical field of electronics, and more specifically, to a decoupling device, radio frequency coil and magnetic resonance imaging apparatus.

BACKGROUND

Magnetic resonance imaging (MRI) is an imaging technology involving biomagnetics and nuclear spin that has advanced rapidly with the development of computer technology, electronic circuit technology and superconductor technology. MRI uses a magnetic field and radio frequency (RF) pulses to induce nutation of processing hydrogen nuclei (i.e., H+) in human tissue to generate RF signals that are processed by a computer to form an image. If an object is placed in a magnetic field and irradiated by suitable electromagnetic waves to produce resonance therein, and electromagnetic waves released thereby are then analyzed, the positions and types of the atomic nuclei of which the object is composed may be learned. On this basis, a precise three-dimensional image of the interior of the object may be drawn. For example, a moving picture of contiguous slices may be obtained by performing an MRI scan of the human brain, starting at the crown and continuing all the way to the base.

In an MRI system, an RF phased array coil is a commonly used type of RF receiving coil. An RF phased array coil includes multiple surface coils, with each surface coil being embodied as an antenna unit. Mutual inductive coupling exists between any two antenna units that are close to each other. By performing decoupling between antenna units, the associated resistance between antenna units may be reduced, in order to reduce associated noise and increase the reception signal-to-noise (SNR) ratio of the RF phased array coil.

In the prior art, methods for decoupling between antenna units may include inductive decoupling, capacitive decoupling, overlap decoupling and low-noise preamplifier decoupling, etc. Inductive decoupling may employ a solenoid formed by coaxially interwoven or adjacent inductive coils wound from spiral wires.

However, as the number of RF coil channels has steadily increased, the coil structures have become ever more complex. Decoupling inductors formed from windings deform easily and do not lend themselves to mass production.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a decoupling device to reduce the degree of deformation is provided.

One or more of the present embodiments provide an RF coil to reduce the degree of deformation.

One or more of the present embodiments provide a magnetic resonance imaging (MRI) apparatus to reduce the degree of deformation.

A decoupling device includes a first substrate, a first inductive coil printed on the first substrate, a second substrate, a second inductive coil printed on the second substrate, and a joining component for joining the first substrate to the second substrate. The first inductive coil and second inductive coil have an area of overlap.

The joining component includes a fastener and a slot. The fastener is arranged on the first substrate. The slot is arranged on the second substrate, and the fastener engages with the slot.

In one embodiment, there are at least two of the slots, and the size of the area of overlap is adjusted by the slot that engages with the fastener.

The first inductive coil is a spiral inductive coil, and/or the second inductive coil is a spiral inductive coil.

The first substrate includes a guide hole. The first inductive coil is printed on a front surface and a back surface of the first substrate by passing through the guide hole, and/or the second substrate includes a guide hole. The second inductive coil is printed on a front surface and a back surface of the second substrate by passing through the guide hole.

The first inductive coil and/or second inductive coil is formed by copper, tin, a lead-tin alloy, a tin-copper alloy, or a combination thereof.

An RF coil including the decoupling device as described above, a first antenna unit and a second antenna unit is provided. The first antenna unit is connected to the first inductive coil, and the second antenna unit is connected to the second inductive coil.

The second antenna unit is adjacent or second-adjacent to the first antenna unit.

The RF coil is an RF phased array coil.

An MRI system includes the RF coil as described above.

In one or more of the present embodiments, the decoupling device includes a first substrate, a first inductive coil printed on the first substrate, a second substrate, a second inductive coil printed on the second substrate, and a joining component for joining the first substrate to the second substrate. The first inductive coil and second inductive coil have an area of overlap. When one or more of the present embodiments are applied, wiring is laid on a printed circuit board to replace an inductor wound from metal wire, so the inductor will not deform. The inductor dimensions, once determined, will not have an error of more than +/−0.01, so the inductor dimensions may meet very high requirements in terms of uniformity and precision.

In addition, the size of the coupled inductance may be adjusted by changing the relative positions of the slots and fastener, facilitating mass production of RF coils.

DETAILED DESCRIPTION

Particular embodiments described here are intended merely to illustrate, not to define the scope of protection.

Figure 1:
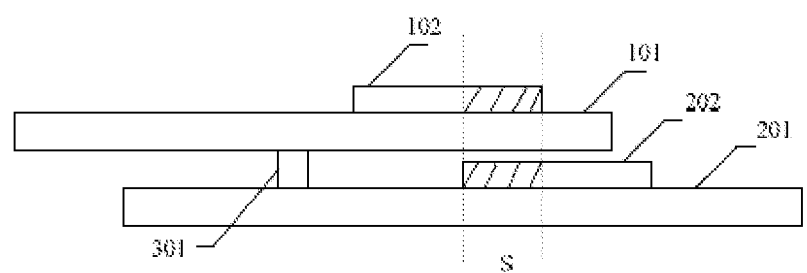
FIG. 1 is a demonstrative structural diagram of one embodiment of a decoupling device.

FIG. 1 is a structural diagram of one embodiment of a decoupling device.

As FIG. 1 shows, the decoupling device includes a first substrate 101, a first inductive coil 102 printed on the first substrate 101, a second substrate 201, a second inductive coil 202 printed on the second substrate 201, and a joining component 301. The joining component 301 is for joining the first substrate 101 to the second substrate 201, so that the first inductive coil 102 and second inductive coil 202 have an area of overlap. As FIG. 1 shows, the area of overlap of the first inductive coil 102 and second inductive coil 202 is S.

In the embodiments, wiring may be laid on a single-layer or multi-layer printed circuit board to replace the inductor wound from metal wires in the prior art. The line width, cross-sectional area and number of turns of the first inductive coil 102 and the second inductive coil 202 may be set at will. Since the first inductive coil 102 and the second inductive coil 202 are arranged by laying out wiring on printed circuit boards, the inductive coil dimensions, once determined, may not have an error of more than +/−0.01. Therefore, the degree of deformation may be reduced significantly, and mass production of RF coils is greatly facilitated.

The starting materials from which the first substrate 101 and the second substrate 201 may be made include phenolic laminated cardboard, glass fiber board, and plastic boards of various kinds, etc. For example, the main components of the first substrate 101 and second substrate 201 may include:

FR-1—phenolic cotton paper; this substrate is generally known as phenolic laminated cardboard (more economical than FR-2);
FR-2—phenolic cotton paper;
FR-3—cotton paper and epoxy resin;
FR-4—woven glass and epoxy resin;
FR-5—woven glass and epoxy resin;
FR-6—matte glass and polyester;
G-10—woven glass and epoxy resin;
CEM-1—cotton paper and epoxy resin (flame retardant);
CEM-2—cotton paper and epoxy resin (not flame retardant);
CEM-3—woven glass and epoxy resin;
CEM-4—woven glass and epoxy resin;
CEM-5—woven glass and polyester;
AIN—aluminum nitride;
SIC—silicon carbide.

The main components of the first substrate 101 and the second substrate 201 are listed above in detail, but those skilled in the art will realize that such a listing is merely demonstrative, and not intended to define the scope of protection of the present invention.

In one embodiment, the joining component 301 may include a fastener and a slot. The fastener is arranged on the first substrate 101, while the slot is arranged on the second substrate 201. The fastener may engage with the slot, and when the fastener engages with the slot, the first inductive coil 102 and second inductive coil 202 may have an area of overlap.

In one embodiment, there may be multiple slots (e.g., at least two). By changing the slot that engages with the fastener, the area of overlap S of the first inductive coil 102 and the second inductive coil 202 may also change (e.g., the area of overlap S of the first inductive coil 102 and second inductive coil 202 is adjusted by the slot that engages with the fastener).

In one embodiment, the first inductive coil 102 may be embodied as a spiral inductive coil, while the second inductive coil 202 may also be embodied as a spiral inductive coil.

In one embodiment, the first substrate 101 may also include one or more guide holes. The first inductive coil 101 is printed on a front surface and a back surface of the first substrate 101 by passing through the guide holes in the first substrate 101. The second substrate 201 may also include one or more guide holes. The second inductive coil 202 is printed on a front surface and a back surface of the second substrate 201 by passing through the guide holes in the second substrate 201.

In one embodiment, the first inductive coil 101 and second inductive coil 102 may be formed by at least one of the following: copper, tin, lead-tin alloy, tin-copper alloy, etc.

In one or more of the present embodiments, wiring is laid on a printed circuit board to replace an inductor wound from metal wire. The printed circuit board may be a single-sided board, a double-sided board, a four-layer board, a six-layer board and other multi-layer circuit boards, etc.

Figure 2:
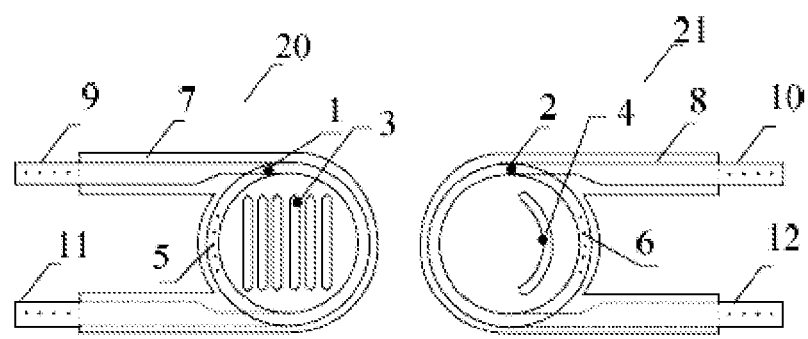
FIG. 2 is an exploded schematic diagram of a decoupling device according to an embodiment.

Based on the detailed analysis above, FIG. 2 is an exploded schematic diagram of a decoupling device according to an embodiment.

As FIG. 2 shows, the decoupling device includes a first inductive assembly 20 and a second inductive assembly 21.

The first inductive assembly 20 includes a first substrate 7 and a first inductive coil 1 printed on the first substrate 7. The first inductive coil 1 is a spiral inductor. Guide holes 5 are also provided on the first substrate 7. The first inductive coil 1 may be printed on a front surface and a back surface of the first substrate 7 by passing through the guide holes 5. The line width, cross-sectional area and number of turns of the first inductive coil 1 may all be changed at will.

Multiple slots 3 are also provided on the first substrate 7 inside the first inductive coil 1. The first inductive coil 1 also has two connecting wires 9 and 11, for connection to the outside.

The second inductive assembly 21 includes a second substrate 8 and a second inductive coil 2 printed on the second substrate 8. The second inductive coil 2 is a spiral inductor. Guide holes 6 are also provided on the second substrate 8. The second inductive coil 2 may be printed on a front surface and a back surface of the second substrate 8 by passing through the guide holes 6. The line width, cross-sectional area and number of turns of the second inductive coil 2 may all be changed at will.

A fastener 4 is also provided on the second substrate 8 inside the second inductive coil 2. The second inductive coil 2 also has two connecting wires 10 and 12, for connection to the outside. The fastener 4 may be embodied as an additional object on the second substrate 8 inside the second inductive coil 2, or as a slot in the second substrate 8 inside the second inductive coil 2.

The first substrate 7 and second substrate 8 may be joined by engaging the fastener 4 with the slot 3, so that the first inductive coil 1 and second inductive coil 2 may have an area of overlap. By selecting the slot 3 to be engaged with the fastener 4, the area of overlap of the first inductive coil 1 and second inductive coil 2 may be adjusted, thereby enabling the coupled inductance of the first inductive coil 1 and the second inductive coil 2 to be adjusted.

Figure 3:
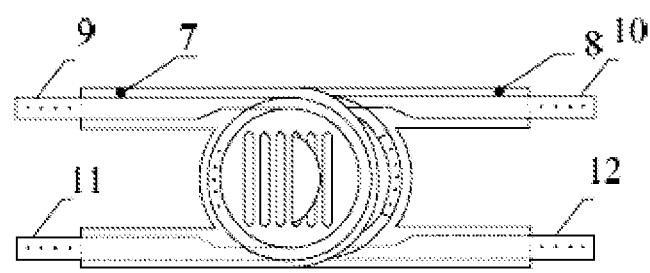
FIG. 3 is a schematic diagram of the decoupling device according to an embodiment in a joined state.

FIG. 3 is a schematic diagram of the decoupling device according to an embodiment in a joined state. In FIG. 3, the first inductive assembly 20 and the second inductive assembly 21 shown in FIG. 2 have been joined.

FIG. 3 shows that by engaging the fastener 4 with a slot 3, the first substrate 7 may be joined to the second substrate 8, so that the first inductive coil 1 and the second inductive coil 2 may have an area of overlap.

The first inductive coil 1 and the second inductive coil 2 may be positioned together using corresponding fastener and slots. By laying wiring on printed circuit boards, dimensions such as the line width, cross-sectional area and number of turns of the first inductive coil 1 and the second inductive coil 2 may be set at will. Thus, adjustment is flexible. Since the first inductive coil 1 and the second inductive coil 2 are printed on corresponding substrates, the inductor dimensions, once determined, will not have an error of more than +/−0.01, so the inductor dimensions are able to meet very high requirements in terms of uniformity and precision. The inductors will thus not deform. In addition, the size of the coupled inductance may be adjusted conveniently by changing the relative positions of the slots and fastener, facilitating mass production of RF coils.

One or more of the present embodiments may be used for decoupling between adjacent antenna units or second-adjacent antenna units in a magnetic resonance RF coil. By changing the position of engagement of the fastener and slots, the coupling between adjacent antenna units or second-adjacent antenna units may be adjusted to achieve an ideal decoupling effect, reduce the associated noise, and increase the reception SNR of the RF coil.

Figure 4:
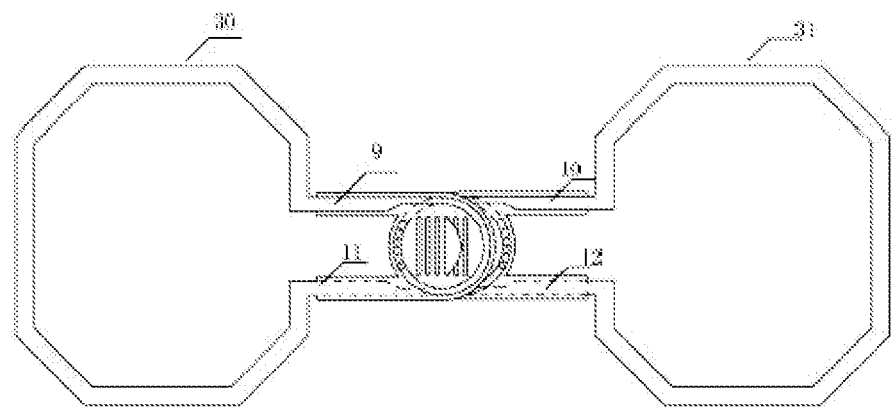
FIG. 4 is a structural diagram of one embodiment of a decoupling device applied to an RF coil.

FIG. 4 is a structural diagram of one embodiment of a decoupling device applied to a magnetic resonance RF coil. In FIG. 4, the decoupling device shown in FIG. 3 is used.

As FIG. 4 shows, the RF coil includes a first antenna unit 30 and a second antenna unit 31 adjacent to the first antenna unit 30. The first antenna unit 30 is connected to the two connecting wires 9 and 11 of the first inductive coil 1. The second antenna unit 31 is connected to the two connecting wires 10 and 12 of the second inductive coil 2. By changing the position of engagement of the fastener and slots in the decoupling device, the coupling between the first antenna unit 30 and second antenna unit 31 may be adjusted to achieve an ideal decoupling effect, and thereby reduce the associated noise and increase the reception SNR of the RF coil.

In one embodiment, the RF coil may be embodied as an RF phased array coil.

The RF coil shown in FIG. 4 may also be used in an MRI system. The RF coil may receive human body magnetic resonance signals through the antenna units, and send these signals to a receiver via RF channels.

In one or more of the present embodiments, the decoupling device includes a first substrate, a first inductive coil printed on the first substrate, a second substrate, a second inductive coil printed on the second substrate, and a joining component. The joining component is for joining the first substrate to the second substrate. The first inductive coil and the second inductive coil have an area of overlap. When one or more of the present embodiments are applied, wiring is laid on a printed circuit board to replace an inductor wound from metal wire, so the inductor will not deform. The inductor dimensions, once determined, will not have an error of more than +/−0.01, so may meet very high requirements in terms of uniformity and precision. In addition, the size of the coupled inductance may be conveniently adjusted by changing the relative positions of the slots and fastener, facilitating mass production of RF coils.

The embodiments above are not intended to define the scope of protection. Any amendments, equivalent substitutions or improvements etc. made within the spirit and principles of the present invention are included in the scope of protection.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A decoupling device comprising:
   a first substrate;
   a first inductive coil disposed on the first substrate;
   a second substrate;
   a second inductive coil disposed on the second substrate; and
   a joining component that joins the first substrate to the second substrate,
   wherein the first inductive coil and second inductive coil have an area of overlap when the first substrate and the second substrate are joined by the joining component, and
   wherein the first inductive coil is connected to a first antenna unit, and the second inductive coil is connected to a second antenna unit.

2. The decoupling device of claim 1, wherein the joining component comprises a fastener and a slot, and
   wherein the fastener is arranged on the first substrate, the slot is arranged on the second substrate, and the fastener engages with the slot.

3. The decoupling device of claim 2, wherein the slot is a first slot,
   wherein the joining component further comprises a second slot, and
   wherein the size of the area of overlap is adjusted by the first slot.

4. The decoupling device of claim 1, wherein the first inductive coil is a spiral inductive coil, the second inductive coil is a spiral inductive coil, or the first inductive coil is a spiral inductive coil and the second inductive coil is a spiral inductive coil.

5. The decoupling device of claim 1, wherein the first substrate comprises a guide hole, the first inductive coil being printed on a front surface and a back surface of the first substrate by passing through the guide hole, the second substrate comprises a guide hole, the second inductive coil being printed on a front surface and a back surface of the second substrate by passing through the guide hole, or a combination thereof.

6. The decoupling device of claim 1, wherein the first inductive coil, the second inductive coil, or the first inductive coil and the second inductive coil are formed by copper, tin, a lead-tin alloy, a tin-copper alloy, or a combination thereof.

7. A radio frequency (RF) coil comprising:
   a decoupling device comprising:
      a first substrate;
      a first inductive coil disposed on the first substrate;
      a second substrate;

a second inductive coil disposed on the second substrate; and a joining component that joins the first substrate to the second substrate, wherein the first inductive coil and second inductive coil have an area of overlap;

a first antenna unit; and a second antenna unit, wherein the first antenna unit is connected to the first inductive coil, and the second antenna unit is connected to the second inductive coil.

8. The RF coil of claim 7, wherein the second antenna unit is adjacent or second-adjacent to the first antenna unit.

9. The RF coil of claim 7, wherein the RF coil is an RF phased array coil.

10. The RF coil of claim 7, wherein the joining component comprises a fastener and a slot, and wherein the fastener is arranged on the first substrate, the slot is arranged on the second substrate, and the fastener engages with the slot.

11. The RF coil of claim 10, wherein the slot is a first slot, wherein the joining component further comprises a second slot, and wherein the size of the area of overlap is adjusted by the first slot.

12. The RF coil of claim 7, wherein the first inductive coil is a spiral inductive coil, the second inductive coil is a spiral inductive coil, or the first inductive coil is a spiral inductive coil and the second inductive coil is a spiral inductive coil.

13. The RF coil of claim 7, wherein the first substrate comprises a guide hole, the first inductive coil being printed on a front surface and a back surface of the first substrate by passing through the guide hole, the second substrate comprises a guide hole, the second inductive coil being printed on a front surface and a back surface of the second substrate by passing through the guide hole, or a combination thereof.

14. The RF coil of claim 7, wherein the first inductive coil, the second inductive coil, or the first inductive coil and the second inductive coil are formed by copper, tin, a lead-tin alloy, a tin-copper alloy, or a combination thereof.

15. A magnetic resonance imaging system comprising:

a radio frequency (RF) coil comprising:

a decoupling device comprising:

a first substrate;

a first inductive coil disposed on the first substrate;

a second substrate;

a second inductive coil disposed on the second substrate; and a joining component that joins the first substrate to the second substrate, wherein the first inductive coil and second inductive coil have an area of overlap;

a first antenna unit; and a second antenna unit, wherein the first antenna unit is connected to the first inductive coil, and the second antenna unit is connected to the second inductive coil.

16. The magnetic resonance imaging system of claim 15, wherein the second antenna unit is adjacent or second-adjacent to the first antenna unit.

17. The magnetic resonance imaging system of claim 15, wherein the RF coil is an RF phased array coil.

* * * * *